United States Patent
Xiao et al.

(10) Patent No.: US 11,808,799 B2
(45) Date of Patent: Nov. 7, 2023

(54) FAULT DETECTION METHOD AND APPARATUS FOR THREE-PHASE POWER DISTRIBUTION SYSTEM

(71) Applicant: Huawei Digital Power Technologies Co., Ltd., Shenzhen (CN)

(72) Inventors: Gang Xiao, Xi'an (CN); Zhiqing Wu, Shanghai (CN); Shaohui Zhong, Xi'an (CN)

(73) Assignee: Huawei Digital Power Technologies Co., Ltd., Shenzhen (CN)

( * ) Notice: Subject to any disclaimer, the term of this patent is extended or adjusted under 35 U.S.C. 154(b) by 0 days.

(21) Appl. No.: 17/681,386

(22) Filed: Feb. 25, 2022

(65) Prior Publication Data
US 2022/0276296 A1    Sep. 1, 2022

(30) Foreign Application Priority Data
Feb. 26, 2021   (CN) .......................... 202110220170.0

(51) Int. Cl.
  *G01R 31/08*   (2020.01)
  *G01R 19/165*  (2006.01)

(52) U.S. Cl.
  CPC ..... *G01R 31/085* (2013.01); *G01R 19/16576* (2013.01)

(58) Field of Classification Search
  CPC .................. G01R 31/085; G01R 19/16576; G01R 31/58; G01R 31/54
  See application file for complete search history.

(56) References Cited

U.S. PATENT DOCUMENTS

2015/0309085 A1 *  10/2015  Fieldbinder ........ G01R 19/0084
                                                           702/64

FOREIGN PATENT DOCUMENTS

| CN | 102801131 A | 11/2012 | | |
|---|---|---|---|---|
| CN | 105182177 B | 6/2018 | | |
| CN | 112379218 A | 2/2021 | | |
| EP | 2822128 A2 * | 1/2015 | ............. | G01R 31/54 |
| EP | 2940821 A1 | 11/2015 | | |
| GB | 2578339 A * | 5/2020 | ............. | H02H 3/338 |
| WO | WO-2012045103 A1 * | 4/2012 | ........... | G01R 31/026 |

* cited by examiner

*Primary Examiner* — Daniel R Miller
(74) *Attorney, Agent, or Firm* — Leydig, Voit & Mayer, Ltd.

(57) ABSTRACT

A fault detection method for a three-phase power distribution system, which includes three phase lines and a neutral line. The three phase lines intersect with the neutral line at a neutral point, the three phase lines include a first phase line, a second phase line, and a third phase line, and at least one of the three phase lines is connected to the neutral line. The method includes: obtaining a voltage between every two phase lines; obtaining a voltage between each phase line and the neutral point based on the voltage between every two phase lines; obtaining a voltage between the neutral line and the neutral point based on a voltage between each phase line and the neutral line and the voltage between each phase line and the neutral point; and detecting the voltage between the neutral line and the neutral point, whether a fault occurs in the neutral line.

20 Claims, 6 Drawing Sheets

FAULT DETECTION METHOD AND APPARATUS FOR THREE-PHASE POWER DISTRIBUTION SYSTEM

CROSS-REFERENCE TO RELATED APPLICATION

This application claims priority to Chinese Patent Application No. 202110220170.0, filed on Feb. 26, 2021, which is hereby incorporated by reference in its entirety.

TECHNICAL FIELD

Embodiments of this application relate to the field of circuit technologies, and in particular, to a fault detection method and apparatus for a three-phase power distribution system.

BACKGROUND

In a three-phase four-wire or three-phase five-wire low-voltage power distribution system, a neutral line can well maintain a neutral point zero potential. However, when a line break fault occurs in the neutral line, a neutral point potential is shifted, and a load after a line break location has different degrees of overvoltage, which greatly affects normal working and control performance of an inverter. Therefore, it is very necessary to accurately determine whether the line break fault occurs in the neutral line.

Currently, a three-phase voltage common-mode component scheme is usually used to detect a neutral line break fault. However, false detection occurs in some special scenarios because grid adaptability of the method is poor. Consequently, fault detection accuracy is low.

SUMMARY

This application provides a fault detection method and apparatus, to improve accuracy of detecting a neutral line break fault in a three-phase power distribution system.

According to a first aspect, this application provides a fault detection method for a three-phase power distribution system. The three-phase power distribution system includes three phase lines and a neutral line. The three phase lines intersect with the neutral line at a neutral point, the three phase lines include a first phase line, a second phase line, and a third phase line, and at least one of the three phase lines is connected to the neutral line.

The method includes: obtaining a voltage between every two phase lines; determining a voltage between each phase line and the neutral point based on the voltage between every two phase lines; determining a voltage between the neutral line and the neutral point based on a voltage between each phase line and the neutral line and the voltage between each phase line and the neutral point; and determining, based on the voltage between the neutral line and the neutral point, whether a line break fault occurs in the neutral line.

In this method, the neutral line and some or all of the phase lines are connected in the three-phase power distribution system, so that deviations of voltages in the three phase lines from a voltage in the neutral line are greater than deviations of the voltages in the three phase lines from a voltage in a true neutral line in the three-phase power distribution system. The voltage between the neutral line and the neutral point is calculated based on the voltage between each phase line and the neutral line and the voltage between each phase line and the neutral point, so that a voltage with high accuracy can be obtained through calculation, and accuracy of determining, based on the voltage, whether the line break fault occurs in the neutral line is improved. Detection accuracy is high in scenarios in which a PE line is not connected, a three-phase grid is unbalanced, there are harmonics, and the like. Therefore, the method can reduce false detection because of high grid adaptability. This improves detection accuracy.

In a possible design, any phase line connected to the neutral line is connected to the neutral line by using a resistor element.

In this method, the phase line and the neutral line are connected by using the resistor element in the three-phase power distribution system. Therefore, implementation costs are very low, and an operation is simple and is easily implemented.

In a possible design, the obtaining a voltage between every two phase lines includes: obtaining the voltage between each phase line and the neutral line; and determining the voltage between every two phase lines based on the voltage between each phase line and the neutral line.

In this method, after the voltage between each phase line and the neutral line is obtained, the voltage between every two phase lines can be calculated simply and quickly based on a vector feature of the voltage. Therefore, very low complexity of a calculation process can be ensured in addition to improvement of detection accuracy, to help determine the voltage between each phase line and the neutral point subsequently.

In a possible design, the obtaining a voltage between every two phase lines includes: obtaining a voltage between the first phase line and the neutral line, a voltage between the second phase line and the neutral line, and a voltage between the first phase line and the third phase line; determining a voltage between the first phase line and the second phase line based on the voltage between the first phase line and the neutral line and the voltage between the second phase line and the neutral line; determining a voltage between the third phase line and the neutral line based on the voltage between the first phase line and the neutral line and the voltage between the first phase line and the third phase line; and determining a voltage between the second phase line and the third phase line based on the voltage between the second phase line and the neutral line and the voltage between the third phase line and the neutral line.

In this method, after a voltage between each of any two phase lines and the neutral line and a voltage between any one of the any two phase lines and one phase line other than the any two phase lines are obtained among the three phase lines, the voltage between every two phase lines and the voltage between any phase line and the neutral line can be calculated simply and quickly based on a vector feature of the voltage. Therefore, very low complexity of a calculation process can be ensured in addition to improvement of detection accuracy, to help determine the voltage between each phase line and the neutral point subsequently.

In a possible design, the voltage between the first phase line and the second phase line satisfies the following formula:

$$V_1 = |\sqrt{V_2^2 + V_3^2 - 2V_2V_3\cos\theta}|$$

Herein, $V_1$ is the voltage between the first phase line and the second phase line, $V_2$ is the voltage between the first phase line and the neutral line, $V_3$ is the voltage between the second phase line and the neutral line, and $\theta$ is a phase difference between $V_2$ and $V_3$.

In this method, a triangle model can be obtained based on a vector diagram of the voltage between each phase line and the neutral line, and the voltage between every two phase lines can be determined simply and quickly based on characteristics of the triangle.

In a possible design, the voltage between the third phase line and the neutral line satisfies the following formula:

$$V_4 = |\sqrt{V_5^2 + V_6^2 - 2V_5 V_6 \cos\sigma}|$$

Herein, $V_4$ is the voltage between the third phase line and the neutral line, $V_5$ is the voltage between the first phase line and the neutral line, $V_6$ is the voltage between the first phase line and the third phase line, and $\sigma$ is a phase difference between $V_5$ and $V_6$.

In this method, after a triangle model is established based on the voltage between the first phase line and the neutral line, the voltage between the first phase line and the third phase line, and the voltage between the third phase line and the neutral line, a third voltage can be determined simply and quickly based on any two of the voltages according to the cosine theorem of the triangle model.

In a possible design, the determining a voltage between each phase line and the neutral point based on the voltage between every two phase lines includes: constructing a target triangle model in a specified coordinate system based on the voltage between every two phase lines, where three side lengths of the target triangle model each are the voltage between every two phase lines; determining, in the specified coordinate system, a target point corresponding to the target triangle model, where an included angle of 120° can be formed by intersecting connection lines between the target point and any two endpoints of the target triangle model; determining a distance between the target point and each endpoint of the target triangle model; and using the distance between the target point and each endpoint as a value of the voltage between each phase line and the neutral point.

In this method, the target triangle model is constructed based on data about the voltage between every two phase lines, and the target point used to represent the neutral point is determined based on the target triangle model, so that accuracy of a parameter of the determined neutral point can be ensured, and an error of directly detecting a voltage at the neutral point can be greatly reduced, to further improve accuracy of detecting a line break fault based on the voltage between the neutral point and the neutral line, and reduce false detection.

In a possible design, if three interior angles of the target triangle model each are less than 120°, the target point is a Fermat point of the target triangle model, or the target point is a positive equiangular center point of the target triangle model.

In this method, a positive equiangular center point of a triangle or a Fermat point of a triangle whose three interior angles each are less than 120° trisects a round angle around the point, and characteristics of the point are the same as those of the neutral point in the three-phase power distribution system. Therefore, a voltage at the neutral point can be accurately determined by calculating the positive equiangular center point or the Fermat point of the target triangle model.

In a possible design, the three side lengths of the target triangle model are a first side length, a second side length, and a third side length. The determining, in the specified coordinate system, a target point corresponding to the target triangle model includes: constructing, in the specified coordinate system, a first target circle model corresponding to the first side length and a second target circle model corresponding to the second side length, where the first target circle model includes two endpoints of the first side length and the target point, and the second target circle model includes two endpoints of the second side length and the target point; determining coordinates of a circle center of the first target circle model based on coordinates of the two endpoints of the first side length, and determining coordinates of a circle center of the second target circle model based on coordinates of the two endpoints of the second side length; and determining coordinates of the target point based on the coordinates of the circle center of the first target circle model and the coordinates of the circle center of the second target circle model.

In this method, the target point used to represent the neutral point in the target triangle model is determined based on auxiliary circle models (the first target circle model and the second target circle model). This can improve detection precision by using a calculation method of a mathematical model, to ensure reliability of a detection result.

In a possible design, the coordinate origin of the specified coordinate system is any endpoint of the target triangle model, and a coordinate axis of the specified coordinate system coincides with a side length of the coordinate origin in the target triangle model.

In this method, the specified coordinate system is established based on the target triangle model. This can simply coordinate calculation steps based on a relationship between a side length and an angle of the target triangle model, and reduce a data calculation amount for calculating related coordinates in the coordinate system, to determine the coordinates of the target point more quickly and simply.

In a possible design, the determining a voltage between the neutral line and the neutral point based on a voltage between each phase line and the neutral line and the voltage between each phase line and the neutral point includes: determining a target difference corresponding to each phase line, where a target difference corresponding to a target phase line is a difference between the following two voltages: a voltage between the target phase line and the neutral line and a voltage between the target phase line and the neutral point; and using a largest value in target differences corresponding to the three phase lines as the voltage between the neutral line and the neutral point.

In this method, a maximum value of a difference between a three phase-to-neutral line voltage and a three phase-to-reference ground (neutral line) voltage obtained through sampling is used as the voltage between the neutral line and the neutral point, and fault detection is performed based on the voltage, which can further improve a fault tolerance rate and reduce false detection.

In a possible design, the determining, based on the voltage between the neutral line and the neutral point, whether a line break fault occurs in the neutral line includes: determining whether the voltage between the neutral line and the neutral point is greater than a specified threshold; and if determining that the voltage between the neutral line and the neutral point is greater than the specified threshold, determining that the line break fault occurs in the neutral line, or if determining that the voltage between the neutral line and the neutral point is not greater than the specified threshold, determining that the line break fault does not occur in the neutral line.

In this method, in a normal condition, there is no current in the neutral line in the three-phase power distribution system. In this case, the voltage between the neutral line and the neutral point needs to be zero. When the voltage between the neutral line and the neutral point is not zero, it indicates that the neutral line may be faulty. Therefore, in the foregoing method, it may be quickly determined whether the line break fault occurs in the neutral line.

According to a second aspect, this application provides a fault detection apparatus for a three-phase power distribution system. The three-phase power distribution system includes three phase lines and a neutral line. The three phase lines intersect with the neutral line at a neutral point, the three phase lines include a first phase line, a second phase line, and a third phase line, and at least one of the three phase lines is connected to the neutral line.

The fault detection apparatus includes a transceiver module and a processing module. The transceiver module is configured to obtain a voltage between every two phase lines. The processing module is configured to: determine a voltage between each phase line and the neutral point based on the voltage between every two phase lines; determine a voltage between the neutral line and the neutral point based on a voltage between each phase line and the neutral line and the voltage between each phase line and the neutral point; and determine, based on the voltage between the neutral line and the neutral point, whether a line break fault occurs in the neutral line.

In a possible design, any phase line connected to the neutral line is connected to the neutral line by using a resistor element.

In a possible design, when obtaining the voltage between every two phase lines, the transceiver module is specifically configured to: obtain the voltage between each phase line and the neutral line; and determine the voltage between every two phase lines based on the voltage between each phase line and the neutral line.

In a possible design, when obtaining the voltage between every two phase lines, the transceiver module is specifically configured to: obtain a voltage between the first phase line and the neutral line, a voltage between the second phase line and the neutral line, and a voltage between the first phase line and the third phase line; determine a voltage between the first phase line and the second phase line based on the voltage between the first phase line and the neutral line and the voltage between the second phase line and the neutral line; determine a voltage between the third phase line and the neutral line based on the voltage between the first phase line and the neutral line and the voltage between the first phase line and the third phase line; and determine a voltage between the second phase line and the third phase line based on the voltage between the second phase line and the neutral line and the voltage between the third phase line and the neutral line.

In a possible design, the voltage between the first phase line and the second phase line satisfies the following formula:

$$V_1 = |\sqrt{V_2^2 + V_3^2 - 2V_2V_3\cos\theta}|$$

Herein, $V_1$ is the voltage between the first phase line and the second phase line, $V_2$ is the voltage between the first phase line and the neutral line, $V_3$ is the voltage between the second phase line and the neutral line, and $\theta$ is a phase difference between $V_2$ and $V_3$.

In a possible design, the voltage between the third phase line and the neutral line satisfies the following formula:

$$V_4 = |\sqrt{V_5^2 + V_6^2 - 2V_5V_6\cos\sigma}|$$

Herein, $V_4$ is the voltage between the third phase line and the neutral line, $V_5$ is the voltage between the first phase line and the neutral line, $V_6$ is the voltage between the first phase line and the third phase line, and $\sigma$ is a phase difference between $V_5$ and $V_6$.

In a possible design, when determining the voltage between each phase line and the neutral point based on the voltage between every two phase lines, the processing module is specifically configured to: construct a target triangle model in a specified coordinate system based on the voltage between every two phase lines, where three side lengths of the target triangle model each are the voltage between every two phase lines; determine, in the specified coordinate system, a target point corresponding to the target triangle model, where an included angle of 120° can be formed by intersecting connection lines between the target point and any two endpoints of the target triangle model; determine a distance between the target point and each endpoint of the target triangle model; and use the distance between the target point and each endpoint as a value of the voltage between each phase line and the neutral point.

In a possible design, if three interior angles of the target triangle model each are less than 120°, the target point is a Fermat point of the target triangle model, or the target point is a positive equiangular center point of the target triangle model.

In a possible design, the three side lengths of the target triangle model are a first side length, a second side length, and a third side length. When determining, in the specified coordinate system, the target point corresponding to the target triangle model, the processing module is specifically configured to: construct, in the specified coordinate system, a first target circle model corresponding to the first side length and a second target circle model corresponding to the second side length, where the first target circle model includes two endpoints of the first side length and the target point, and the second target circle model includes two endpoints of the second side length and the target point; determine coordinates of a circle center of the first target circle model based on coordinates of the two endpoints of the first side length, and determine coordinates of a circle center of the second target circle model based on coordinates of the two endpoints of the second side length; and determine coordinates of the target point based on the coordinates of the circle center of the first target circle model and the coordinates of the circle center of the second target circle model.

In a possible design, the coordinate origin of the specified coordinate system is any endpoint of the target triangle model, and a coordinate axis of the specified coordinate system coincides with a side length of the coordinate origin in the target triangle model.

In a possible design, when determining the voltage between the neutral line and the neutral point based on the voltage between each phase line and the neutral line and the voltage between each phase line and the neutral point, the processing module is specifically configured to: determine a target difference corresponding to each phase line, where a target difference corresponding to a target phase line is a difference between the following two voltages: a voltage between the target phase line and the neutral line and a voltage between the target phase line and the neutral point; and use a largest value in target differences corresponding to the three phase lines as the voltage between the neutral line and the neutral point.

In a possible design, when determining, based on the voltage between the neutral line and the neutral point, whether the line break fault occurs in the neutral line, the processing module is specifically configured to: determine whether the voltage between the neutral line and the neutral point is greater than a specified threshold; and if determining that the voltage between the neutral line and the neutral point is greater than the specified threshold, determine that the line break fault occurs in the neutral line, or if determining that the voltage between the neutral line and the neutral point is not greater than the specified threshold, determine that the line break fault does not occur in the neutral line.

According to a third aspect, this application provides a fault detection apparatus for a three-phase power distribution system. The three-phase power distribution system includes three phase lines and a neutral line. The three phase lines intersect with the neutral line at a neutral point, the three phase lines include a first phase line, a second phase line, and a third phase line, and at least one of the three phase lines is connected to the neutral line.

The fault detection apparatus includes a transceiver and at least one processor. The transceiver is configured to obtain a voltage between every two phase lines. The processor is configured to: determine a voltage between each phase line and the neutral point based on the voltage between every two phase lines; determine a voltage between the neutral line and the neutral point based on a voltage between each phase line and the neutral line and the voltage between each phase line and the neutral point; and determine, based on the voltage between the neutral line and the neutral point, whether a line break fault occurs in the neutral line.

In a possible design, any phase line connected to the neutral line is connected to the neutral line by using a resistor element.

In a possible design, when obtaining the voltage between every two phase lines, the transceiver is specifically configured to: obtain the voltage between each phase line and the neutral line; and determine the voltage between every two phase lines based on the voltage between each phase line and the neutral line.

In a possible design, when obtaining the voltage between every two phase lines, the transceiver is specifically configured to: obtain a voltage between the first phase line and the neutral line, a voltage between the second phase line and the neutral line, and a voltage between the first phase line and the third phase line; determine a voltage between the first phase line and the second phase line based on the voltage between the first phase line and the neutral line and the voltage between the second phase line and the neutral line; determine a voltage between the third phase line and the neutral line based on the voltage between the first phase line and the neutral line and the voltage between the first phase line and the third phase line; and determine a voltage between the second phase line and the third phase line based on the voltage between the second phase line and the neutral line and the voltage between the third phase line and the neutral line.

In a possible design, the voltage between the first phase line and the second phase line satisfies the following formula:

$$V_1 = |\sqrt{V_2^2 + V_3^2 - 2V_2 V_3 \cos\theta}|$$

Herein, $V_1$ is the voltage between the first phase line and the second phase line, $V_2$ is the voltage between the first phase line and the neutral line, $V_3$ is the voltage between the second phase line and the neutral line, and $\theta$ is a phase difference between $V_2$ and $V_3$.

In a possible design, the voltage between the third phase line and the neutral line satisfies the following formula:

$$V_4 = |\sqrt{V_5^2 + V_6^2 - 2V_5 V_6 \cos\sigma}|$$

Herein, $V_4$ is the voltage between the third phase line and the neutral line, $V_5$ is the voltage between the first phase line and the neutral line, $V_6$ is the voltage between the first phase line and the third phase line, and $\alpha$ is a phase difference between $V_5$ and $V_6$.

In a possible design, when determining the voltage between each phase line and the neutral point based on the voltage between every two phase lines, the processor is specifically configured to: construct a target triangle model in a specified coordinate system based on the voltage between every two phase lines, where three side lengths of the target triangle model each are the voltage between every two phase lines; determine, in the specified coordinate system, a target point corresponding to the target triangle model, where an included angle of 120° can be formed by intersecting connection lines between the target point and any two endpoints of the target triangle model; determine a distance between the target point and each endpoint of the target triangle model; and use the distance between the target point and each endpoint as a value of the voltage between each phase line and the neutral point.

In a possible design, if three interior angles of the target triangle model each are less than 120°, the target point is a Fermat point of the target triangle model, or the target point is a positive equiangular center point of the target triangle model.

In a possible design, the three side lengths of the target triangle model are a first side length, a second side length, and a third side length. When determining, in the specified coordinate system, the target point corresponding to the target triangle model, the processor is specifically configured to: construct, in the specified coordinate system, a first target circle model corresponding to the first side length and a second target circle model corresponding to the second side length, where the first target circle model includes two endpoints of the first side length and the target point, and the second target circle model includes two endpoints of the second side length and the target point; determine coordinates of a circle center of the first target circle model based on coordinates of the two endpoints of the first side length, and determine coordinates of a circle center of the second target circle model based on coordinates of the two endpoints of the second side length; and determine coordinates of the target point based on the coordinates of the circle center of the first target circle model and the coordinates of the circle center of the second target circle model.

In a possible design, the coordinate origin of the specified coordinate system is any endpoint of the target triangle model, and a coordinate axis of the specified coordinate system coincides with a side length of the coordinate origin in the target triangle model.

In a possible design, when determining the voltage between the neutral line and the neutral point based on the voltage between each phase line and the neutral line and the voltage between each phase line and the neutral point, the processor is specifically configured to: determine a target difference corresponding to each phase line, where a target difference corresponding to a target phase line is a difference between the following two voltages: a voltage between the target phase line and the neutral line and a voltage between the target phase line and the neutral point; and use a largest value in target differences corresponding to the three phase lines as the voltage between the neutral line and the neutral point.

In a possible design, when determining, based on the voltage between the neutral line and the neutral point, whether the line break fault occurs in the neutral line, the processor is specifically configured to: determine whether the voltage between the neutral line and the neutral point is greater than a specified threshold; and if determining that the voltage between the neutral line and the neutral point is greater than the specified threshold, determine that the line break fault occurs in the neutral line, or if determining that the voltage between the neutral line and the neutral point is not greater than the specified threshold, determine that the line break fault does not occur in the neutral line.

In a possible design, the fault detection apparatus further includes a memory. The memory is configured to store computer program code. The computer program code includes computer instructions, and the computer program code is provided for the processor for execution.

According to a fourth aspect, an embodiment of this application provides a computer-readable storage medium. The computer-readable storage medium stores computer program instructions; and when the computer program instructions are run on a fault detection apparatus, the fault detection apparatus is enabled to perform the method according to any one of the first aspect or the possible designs of the first aspect.

According to a fifth aspect, an embodiment of this application provides a computer program product. When the computer program product runs on a fault detection apparatus, the fault detection apparatus is enabled to perform the method according to any one of the first aspect or the possible designs of the first aspect.

According to a sixth aspect, an embodiment of this application provides a chip. The chip is configured to read a computer program stored in a memory, to perform the method according to any one of the first aspect or the possible designs of the first aspect.

For beneficial effects of the second aspect to the sixth aspect, refer to the description of the beneficial effects of the first aspect. Details are not described herein again.

DESCRIPTION OF EMBODIMENTS

Figure 1A:
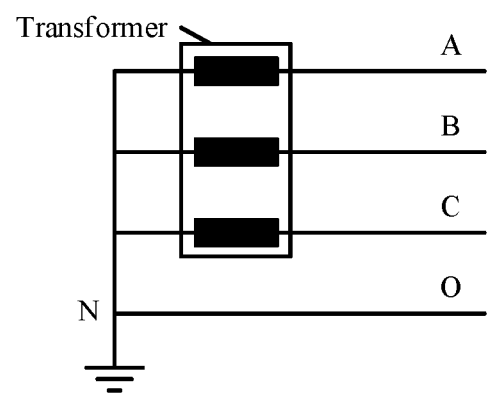
FIG. 1a is a schematic diagram of a circuit in a three-phase four-wire power distribution system.

To make objectives, technical solutions, and advantages of embodiments of this application clearer, the following further describes the embodiments of this application in detail with reference to accompanying drawings. The terms "first" and "second" below in the descriptions of the embodiments of this application are merely used for a description purpose, and shall not be understood as an indication or implication of relative importance or implicit indication of a quantity of indicated technical features. Therefore, a feature limited by "first" or "second" may explicitly or implicitly include one or more features.

It should be understood that, in the embodiments of this application, "at least one" means one or more, and "a plurality of" means two or more. The term "and/or" describes an association relationship between associated objects, and represents that three relationships may exist. For example, A and/or B may represent the following cases: Only A exists, both A and B exist, and only B exists, where A and B may be singular or plural. The character "/" usually represents an "or" relationship between the associated objects. "At least one of the following items (pieces)" or a similar expression thereof indicates any combination of these items, including a single item (piece) or any combination of a plurality of items (pieces). For example, at least one of a, b, and c may indicate a, b, c, a and b, a and c, b and c, or a, b, and c, where a, b, and c may be singular or plural.

For ease of understanding, examples of descriptions of concepts related to this application are provided for reference.

(1) Three-phase power distribution system: The three-phase power distribution system is a power distribution system using a three-phase circuit, for example, a three-phase four-wire or three-phase five-wire power distribution system. The three-phase circuit is powered by a three-phase alternating-current power supply. The three-phase alternating-current power supply can provide three voltages or electromotive forces with a same frequency, a same amplitude, and a phase difference of 120° for three transmission lines (three phase lines) in the three-phase circuit. The three-phase alternating-current power supply may be a generator or a transformer.

In the embodiments of this application, the three-phase power distribution system may be but is not limited to two systems: a three-phase four-wire system and a three-phase five-wire system.

The three-phase four-wire system means that the three-phase power distribution system includes three phase lines and one neutral line (neutral line). In a three-phase power distribution system in the three-phase four-wire system (briefly referred to as a three-phase four-wire power distribution system below), ends of the three phase lines intersect at a neutral point, and the other ends are connected to a load; and one end of the neutral line is led from the neutral point and grounded, and the other end is connected to the load. The three phase lines are used for power transmission, and the neutral line and the three phase lines form a working loop for maintaining balance of voltages in the three phase lines, that is, a phase difference between voltages in any two of the three phase lines is 120°. In the three-phase four-wire power distribution system, there is no current in the neutral line during three-phase balance.

The three-phase five-wire system means that the three-phase power distribution system includes three phase lines, one neutral line, and one protection line (protection zero line). The three-phase five-wire power distribution system is obtained by adding a protective earthing line to the three-phase four-wire power distribution system, to prevent the neutral line from being live and play a protective role.

(2) Neutral point: The neutral point, also referred to as zeros, is a common point of a star connection in a three-phase power distribution system. In terms of a working mode, the neutral point is grounded or not grounded. A neutral line can be led from the neutral point, and the neutral line is grounded through the neutral point.

(3) Load: In physics, the load is an electronic component, an apparatus, or a device connected to two ends of a power supply in a circuit, is configured to convert electrical energy into another form of energy, and is also referred to as an electrical appliance.

FIG. 1a is a schematic diagram of a circuit in a three-phase four-wire power distribution system. As shown in FIG. 1a, a line A, a line B, and a line C are three phase lines in the power distribution system, a line O is a neutral line, and a point N is a neutral point. A transformer may be used as a voltage source to provide a three-phase alternating current. Ends of the three phase lines intersect at the neutral point after passing through the transformer, one end of the neutral line is also connected to the neutral point, and the other ends of the three phase lines and the other end of the neutral line may be connected to a load (not shown in the figure).

Figure 1B:
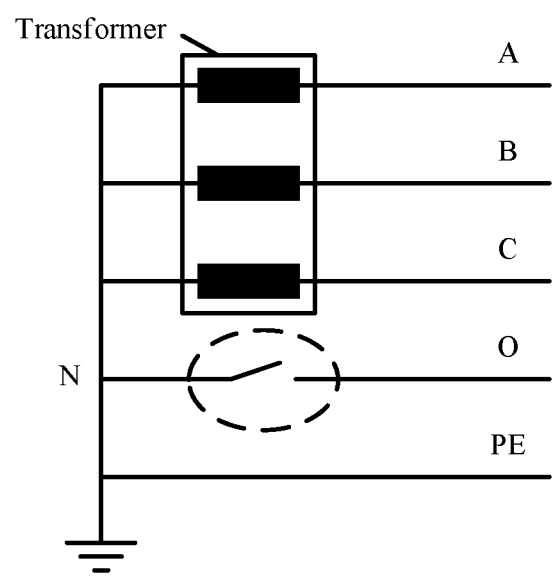
FIG. 1b is a schematic diagram of a circuit in a three-phase five-wire power distribution system.

FIG. 1b is a schematic diagram of a circuit in a three-phase five-wire power distribution system. The three-phase five-wire power distribution system shown in FIG. 1b is obtained by adding a protection line, that is, a PE line to a circuit in the three-phase four-wire power distribution system shown in FIG. Ta. In a circuit in the three-phase five-wire power distribution system, the PE line is used to ensure circuit safety. One end of the PE line is connected to the neutral point, and the other end may be connected to a load (not shown in the figure).

In the circuit in the three-phase four-wire power distribution system shown in FIG. 1a and the circuit in the three-phase five-wire power distribution system shown in FIG. Tb, when a line break fault occurs in the neutral line (for example, as shown in a dashed line box in FIG. 1b), normal working and working performance of the circuit are greatly affected. Currently, a three-phase voltage common-mode component scheme is usually used to detect whether a line break fault occurs in the neutral line in the circuit in the power distribution system. Specifically, whether the line break fault occurs in the neutral line may be determined by detecting whether a three-phase zero sequence voltage or a voltage between the neutral point and the PE line (a voltage between the neutral point and the PE line) is greater than a preset threshold.

For a manner of calculating the three-phase zero sequence voltage, refer to the following formula:

$$v_{ON}=(v_{AO}+v_{BO}+v_{CO})/3$$

Herein, $v_{ON}$ is the three-phase zero sequence voltage, $v_{AO}$ is a measured voltage between the line A and the neutral line, $v_{BO}$ is a measured voltage between the line B and the neutral line, and $v_{CO}$ is a measured voltage between the line C and the neutral line.

False detection occurs in some scenarios because grid adaptability of the foregoing line break fault detection method is poor. For example, when a three-phase voltage is unbalanced or the three-phase voltage has odd harmonics, the detected zero sequence voltage is greater than an actual zero sequence voltage, resulting in a false alarm. Consequently, electric equipment cannot work normally. For another example, when the PE line is not connected in the circuit, detecting a voltage between the neutral line and the PE line may cause a false alarm. Consequently, electric equipment cannot work normally.

In view of this, an embodiment of this application provides a fault detection method for a three-phase power distribution system, to improve accuracy of detecting a neutral line break fault.

The following first describes the three-phase power distribution system provided in the embodiments of this application.

In the embodiments of this application, the three-phase power distribution system, such as a three-phase four-wire power distribution system or a three-phase five-wire power distribution system, includes at least three phase lines and a neutral line. The three phase lines intersect with the neutral line at a neutral point, the three phase lines include a first phase line, a second phase line, and a third phase line, and at least one of the three phase lines is connected to the neutral line, so that a phase difference between voltages in two of the three phase lines is not 120° when a line break fault occurs in the neutral line.

In some embodiments of this application, any phase line connected to the neutral line is connected to the neutral line by using a resistor element.

In some embodiments of this application, at least one phase line is connected to the neutral line by using a resistor element. Among all the phase lines connected to the neutral line, at most two phase lines are connected to the neutral line by using resistor elements having a same resistance value.

Optionally, the three-phase power distribution system may be obtained by connecting at least one of the three phase lines and the neutral line by using a resistor element based on an existing three-phase circuit.

The following describes an example of the three-phase power distribution system with reference to specific examples.

Example 1

Figure 2A:
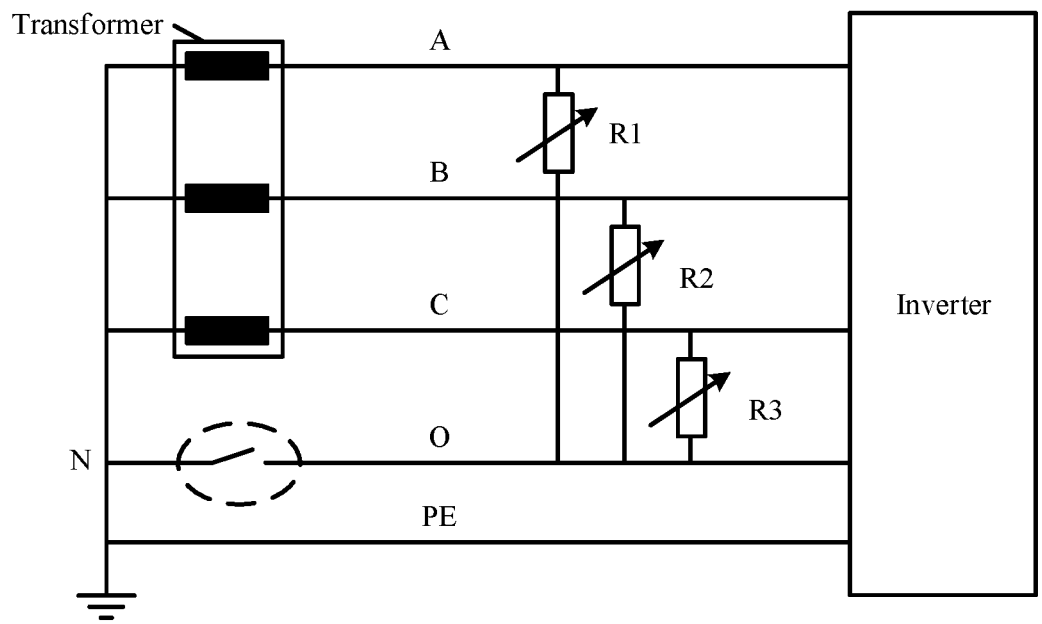
FIG. 2a is a schematic diagram of a circuit in a three-phase power distribution system according to an embodiment of this application.

FIG. 2a is a schematic diagram of a circuit in a three-phase power distribution system according to an embodiment of this application. As shown in FIG. 2a, the power distribution system may be a three-phase five-wire power distribution system. In the three-phase five-wire distribution system, a first phase line, a second phase line, and a third phase line are respectively a line A, a line B, and a line C. Ends of the line A, the line B, and the line C intersect at a neutral point after passing through a transformer, and the other ends may be connected to an inverter. One end of a neutral line is connected to the neutral point (point N), and the other end may be connected to the inverter. Content shown in a dashed line box in the figure indicates that the neutral line is broken herein. If the neutral line is not faulty, a connection line is formed between O and N. The neutral point is grounded. One end of a PE line is grounded (and is also connected to the neutral point), and the other end may be connected to the inverter. In the three-phase five-wire power distribution system, each of the line A, the line B, and the line C is connected to the neutral line by using a resistor element. This can ensure that a phase difference between voltages in any two of the line A, the line B, and the line C is not 120° when a line break fault occurs in the neutral line.

The resistor element may be a variable resistor or a resistor having a fixed resistance value.

For example, as shown in FIG. 2a, the line A is connected to the neutral line by using a variable resistor R1, the line B is connected to the neutral line by using a variable resistor R2, and the line C is connected to the neutral line by using a variable resistor R3. Resistance values of the resistors R1, R2, and R3 may be any one of the following cases:

(1) R1=R2≠R3. To be specific, values of resistance between the neutral line and both of the line A and the line B are the same and different from a value of resistance between the line C and the neutral line.

(2) R1≠R2=R3. To be specific, values of resistance between the neutral line and both of the line B and the line C are the same and different from a value of resistance between the line A and the neutral line.

(3) R1=R3≠R2. To be specific, values of resistance between the neutral line and both of the line A and the line C are the same and different from a value of resistance between the line B and the neutral line.

(4) R1≠R2≠R3. To be specific, values of resistance between the neutral line and all of the line A, the line B, and the line C are different from each other.

Example 2

Figure 2B:
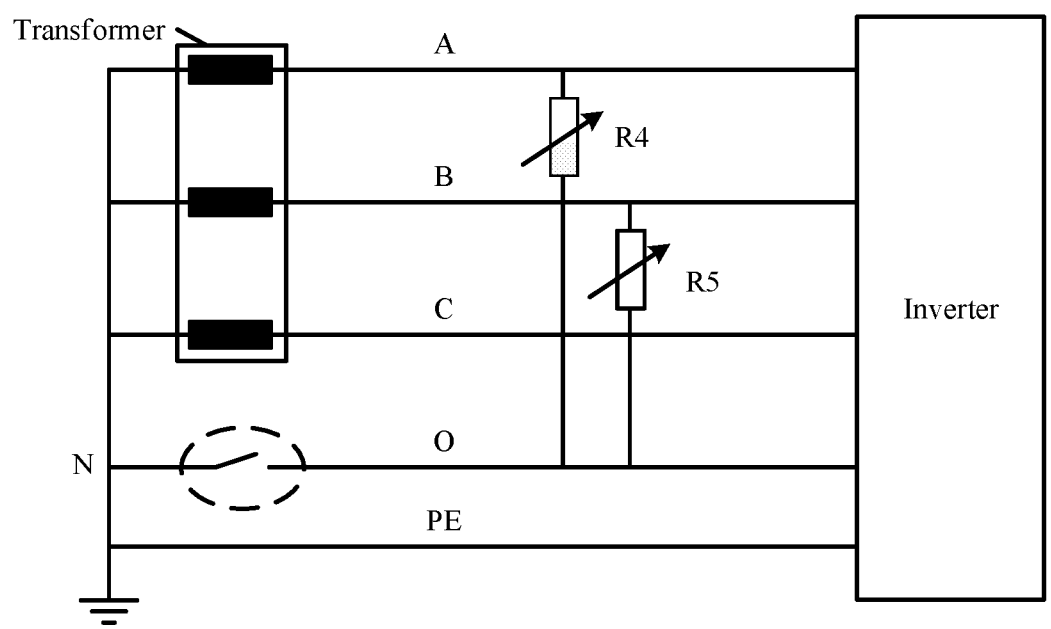
FIG. 2b is a schematic diagram of another circuit in a three-phase power distribution system according to an embodiment of this application.

FIG. 2b is a schematic diagram of another circuit in a three-phase power distribution system according to an embodiment of this application. As shown in FIG. 2b, the power distribution system may be a three-phase five-wire power distribution system. In the three-phase five-wire distribution system, a first phase line, a second phase line, and a third phase line are respectively a line A, a line B, and a line C. Ends of the line A, the line B, and the line C intersect at a neutral point after passing through a transformer, and the other ends may be connected to an inverter. One end of a neutral line is connected to the neutral point, and the other end may be connected to the inverter. The neutral point is grounded. One end of a PE line is grounded (and is also connected to the neutral point), and the other end may be connected to the inverter. In the three phase lines of the line A, the line B, and the line C, each of any two phase lines is connected to the neutral line by using a resistor element. This can also ensure that a phase difference between voltages in the any two of a total of three phase lines of the line A, the line B, and the line C is not 120° when a line break fault occurs in the neutral line.

For example, the any two phase lines may be the line A and the line B. As shown in FIG. 2b, the line A is connected to the neutral line by using a variable resistor R4, and the line B is connected to the neutral line by using a variable resistor R5. Resistance values of R4 and R5 may be the same or different, that is, values of resistance between the neutral line and both of the line A and the line B may be the same or different.

For another example, the any two phase lines may be the line A and the line C, or may be the line B and the line C. Values of resistance between the neutral line and the any two phase lines may be the same or different.

Example 3

In the three-phase power distribution system, only any one of the three phase lines may be connected to the neutral line by using a resistor element. This can also ensure that a phase difference between voltages in any two of a total of three phase lines of the line A, the line B, and the line C is not 120° when a line break fault occurs in the neutral line.

For example, in the three-phase five-wire power distribution system shown in FIG. 2a, only the variable resistor between any one of the three phase lines and the neutral line may be retained, and the variable resistors between the neutral line and the other two phase lines may be removed.

For another example, in the three-phase five-wire power distribution system shown in FIG. 2b, only the variable resistor between any phase line and the neutral line may be retained, and the variable resistor between the other phase line and the neutral line may be removed.

It should be noted that, in FIG. 2a or FIG. 2b, the three-phase five-wire power distribution system is used as an example for description, and a circuit composition of the three-phase power distribution system applicable to the method provided in this application is not limited. The three-phase power distribution system in this application may alternatively be a three-phase four-wire power distribution system in which a manner of the connection between the phase line and the neutral line is used, another three-phase power distribution system, or the like.

The inverter shown in FIG. 2a or FIG. 2b may alternatively be electric equipment such as a rectifier or a load, and some electric equipment may alternatively be added to or deleted from the power distribution system shown in FIG. 2a or FIG. 2b.

In the foregoing embodiments of this application, a resistance value of the resistor connected between the phase line and the neutral line may be set to a large resistance value, for example, a resistance value greater than a specified threshold, to reduce power consumed by the resistor, so as to reduce impact on a three-phase circuit as much as possible while deforming a phase angle between voltages in the three phase lines.

In the foregoing embodiments, a three-phase unbalanced circuit is formed by connecting some or all of the phase lines to the neutral line on a side of an AC port of the electric equipment connected to the three-phase power distribution system. Therefore, in the three-phase power distribution system, a circuit in which a phase difference between voltages between the neutral line and the three phase lines is not 120° when the line break fault occurs in the neutral line can ensure that a phase difference between voltages in at least two of the three phase lines is not 120°, and when the line break fault occurs in the neutral line, deviations of voltages in the three phase lines from a voltage in a reference ground (point O) can be greater than deviations of the voltages in the three phase lines from a voltage in a true neutral line.

The following describes in detail a fault detection method for a three-phase power distribution system that is provided in an embodiment of this application.

It should be noted that the fault detection method provided in this embodiment of this application may be performed based on the three-phase power distribution system provided in the foregoing embodiment.

Descriptions are provided below by using an example in which the fault detection method is performed by a fault detection apparatus. The fault detection apparatus may be any entity that has a data processing function, for example, a computer, a server, or a terminal device.

Figure 3:
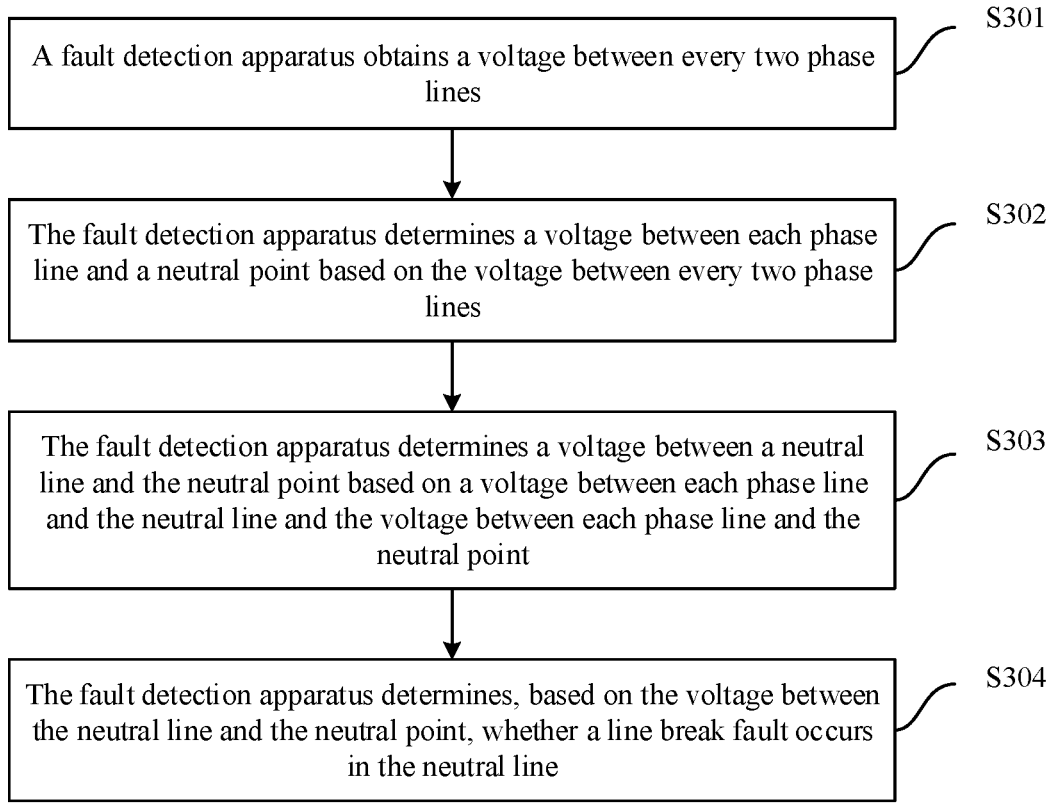
FIG. 3 is a schematic diagram of a fault detection method for a three-phase power distribution system according to an embodiment of this application.

FIG. 3 is a schematic diagram of a fault detection method for a three-phase power distribution system according to an embodiment of this application. The three-phase power distribution system includes three phase lines and a neutral line. The three phase lines intersect with the neutral line at a neutral point, the three phase lines include a first phase line, a second phase line, and a third phase line, and at least one of the three phase lines is connected to the neutral line, so that a phase difference between voltages in two of the three phase lines is not 120° when a line break fault occurs in the neutral line. As shown in FIG. 3, the method includes the following steps.

S301: A fault detection apparatus obtains a voltage between every two phase lines.

The fault detection apparatus may specifically first obtain the voltage between every two of the three phase lines in the three-phase power distribution system in the following manners:

Manner 1

The fault detection apparatus obtains the voltage between every two phase lines through sampling. Specifically, the fault detection apparatus may measure the voltage between every two phase lines by using a specified voltage measurement circuit, or the fault detection apparatus may receive the voltage between every two phase lines that is entered by a user.

Manner 2

The fault detection apparatus may first obtain a voltage between each phase line and the neutral line, and then determine the voltage between every two phase lines based on the voltage between each phase line and the neutral line. The voltage between each phase line and the neutral line is obtained through sampling. Specifically, the fault detection apparatus may measure the voltage between each phase line and the neutral line by using a specified voltage measurement circuit, or the fault detection apparatus may receive the voltage between each phase line and the neutral line that is entered by a user.

Manner 3

The fault detection apparatus may first obtain a voltage between the first phase line and the neutral line, a voltage between the second phase line and the neutral line, and a voltage between the first phase line and the third phase line, and then determine the voltage between every two phase lines based on the obtained three voltages. Specifically, the fault detection apparatus may first determine a voltage between the first phase line and the second phase line based on the voltage between the first phase line and the neutral line and the voltage between the second phase line and the neutral line, and determine a voltage between the third phase line and the neutral line based on the voltage between the first phase line and the neutral line and the voltage between the first phase line and the third phase line; and then determine a voltage between the second phase line and the third phase line based on the voltage between the second phase line and the neutral line and the voltage between the third phase line and the neutral line, and finally obtain the voltage between every two phase lines.

For a manner of obtaining the voltage between the first phase line and the neutral line, the voltage between the second phase line and the neutral line, and the voltage between the first phase line and the third phase line, refer to a manner of obtaining the voltage between every two phase lines or a manner of obtaining the voltage between each phase line and the neutral line. Details are not described herein again.

Figure 4:
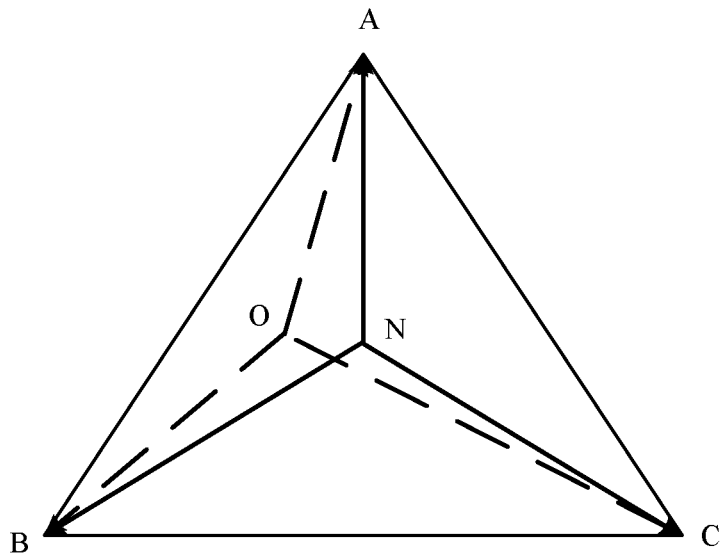
FIG. 4 is a schematic diagram of a voltage vector in a three-phase power distribution system according to an embodiment of this application.

For example, in the circuit in the three-phase power distribution system shown in FIG. 2a or FIG. 2b, a voltage vector corresponding to the voltage between each phase line and the neutral line is shown in FIG. 4.

FIG. 4 is a schematic diagram of a voltage vector in a three-phase power distribution system according to an embodiment of this application. As shown in FIG. 4, a vector OA represents a voltage $V_{AO}$ between a line A and a neutral line, a vector OB represents a voltage $V_{BO}$ between a line B and the neutral line, and a vector OC represents a voltage $V_{CO}$ between a line C and the neutral line. A vector AB represents a voltage $V_{AB}$ between the line A and the line B, a vector AC represents a voltage $V_{AC}$ between the line A and the line C, and a vector BC represents a voltage $V_{BC}$ between the line B and the line C.

An included angle between the vector OA and the vector OB represents a phase difference between $V_{AO}$ and $V_{BO}$, an included angle between the vector OA and the vector OC represents a phase difference between $V_{AO}$ and $V_{CO}$, and an included angle between the vector OB and the vector OC represents a phase difference between $V_{BO}$ and $V_{CO}$. An included angle between the vector AB and the vector AC represents a phase difference between $V_{AB}$ and $V_{BC}$, an included angle between the vector AB and the vector BC represents a phase difference between $V_{AB}$ and $V_{BC}$, and an included angle between the vector AC and the vector BC represents a phase difference between $V_{AC}$ and $V_{BC}$.

In some embodiments of this application, the voltage between the first phase line and the second phase line satisfies the following formula:

$$V_1 = |\sqrt{V_2^2 + V_3^2 - 2V_2 V_3 \cos\theta}|$$

Herein, $V_1$ is the voltage between the first phase line and the second phase line, $V_2$ is the voltage between the first phase line and the neutral line, $V_3$ is the voltage between the second phase line and the neutral line, and $\theta$ is a phase difference between $V_2$ and $V_3$.

For a formula satisfied by the voltage between the first phase line and the third phase line and a formula satisfied by the voltage between the second phase line and the third phase line, refer to the formula satisfied by the voltage between the first phase line and the second phase line. Details are not described herein again.

In Manner 2, the fault detection apparatus may determine a voltage between every two phase lines according to the foregoing formula. In Manner 3, the fault detection apparatus may also determine the voltage between the first phase line and the second phase line and the voltage between the second phase line and the third phase line according to the foregoing formula.

For example, in Manner 2, as shown in FIG. 4, after obtaining the voltages $V_{AO}$, $V_{BO}$, and $V_{CO}$, according to the foregoing formula, the fault detection apparatus may calculate the voltage $V_{AB}$ between the line A and the line B based on $V_{AO}$, $V_{BO}$, and the phase angle between $V_{AO}$ and $V_{BO}$, calculate the voltage $V_{AC}$ between the line A and the line C based on $V_{AO}$, $V_{CO}$, and the phase angle between $V_{AO}$ and $V_{CO}$, and calculate the voltage $V_{BC}$ between the line B and the line C based on $V_{BO}$, $V_{CO}$, and the phase angle between $V_{BO}$ and $V_{CO}$.

In some embodiments of this application, the voltage between the third phase line and the neutral line satisfies the following formula:

$$V_4 = |\sqrt{V_5^2 + V_6^2 - 2V_5 V_6 \cos\sigma}|$$

Herein, $V_4$ is the voltage between the third phase line and the neutral line, $V_5$ is the voltage between the first phase line and the neutral line, $V_6$ is the voltage between the first phase line and the third phase line, and $\sigma$ is a phase difference between $V_5$ and $V_6$.

In Manner 3, the fault detection apparatus may determine the voltage between the third phase line and the neutral line according to the formula, so that the fault detection apparatus determines the voltage between the second phase line and the third phase line based on the voltage between the third phase line and the neutral line and the voltage between the second phase line and the neutral line.

S302: The fault detection apparatus determines a voltage between each phase line and the neutral point based on the voltage between every two phase lines.

After determining the voltage between every two of the three phase lines, the fault detection apparatus constructs a target triangle model in a specified coordinate system based on the voltage between every two phase lines, where three side lengths of the target triangle model each are the voltage between every two phase lines.

In an optional implementation, the specified coordinate system may be any coordinate system in which the established target triangle model is located. In another optional implementation, the coordinate origin of the specified coordinate system is any endpoint of the target triangle model, and a coordinate axis of the specified coordinate system coincides with a side length of the coordinate origin in the target triangle model.

For example, the target triangle model may be a triangle model ABC shown in FIG. 4.

After constructing the target triangle model, the fault detection apparatus determines, in the specified coordinate system, a target point corresponding to the target triangle model, where an included angle of 120° can be formed by intersecting connection lines between the target point and any two endpoints of the target triangle model. In the three-phase power distribution system, when voltages in the three phase lines are balanced, a phase difference between voltages between the neutral point and any two phase lines is 120°. Therefore, the target point corresponding to the target triangle model is the neutral point corresponding to the three-phase power distribution system.

For example, as shown in FIG. 4, the target point corresponding to the target triangle model ABC may be marked as a point N, where connection lines between the point N and all of a point A, a point B, and a point C trisect a round angle around the point N, and an angle ANB, an angle ANC, and an angle BNC each are 120°.

In some embodiments of this application, if three interior angles of the target triangle model each are less than 120°, the target point is a Fermat point of the target triangle model, or the target point is a positive equiangular center point of the target triangle model.

The Fermat point is a point located in a triangle, where a sum of distances between the point and three vertices of the triangle is the smallest. If three interior angles of the triangle each are less than 120°, distance connection lines between the Fermat point and the three vertices exactly trisect a round angle around the Fermat point. To be specific, three spread angles of the Fermat point to three sides of the triangle are the same and each are 120°. Therefore, when the three interior angles of the target triangle model each are less than 120°, the point N may be determined by using a method for calculating the Fermat point of the target triangle model. Distance connection lines between the positive equiangular center point and the three vertices also exactly trisect a round angle around the positive equiangular center point. To be specific, three spread angles of the positive equiangular center point to the three sides of the triangle are the same and each are 120°. Therefore, in this embodiment of this application, the point N may also be determined by using a method for calculating the positive equiangular center point of the target triangle model.

In some embodiments of this application, the three side lengths of the target triangle model are a first side length, a second side length, and a third side length. When determining the target point corresponding to the target triangle model, the fault detection apparatus may first construct, in the specified coordinate system, a first target circle model corresponding to the first side length and a second target circle model corresponding to the second side length, where the first target circle model includes two endpoints of the first side length and the target point, and the second target circle model includes two endpoints of the second side length and the target point; then determine coordinates of a circle center of the first target circle model based on coordinates of the two endpoints of the first side length, and determine coordinates of a circle center of the second target circle model based on coordinates of the two endpoints of the second side length; and finally determine coordinates of the target point based on the coordinates of the circle center of the first target circle model and the coordinates of the circle center of the second target circle model.

After determining the coordinates of the target point, the fault detection apparatus determines a distance between the target point and each endpoint of the target triangle model; and uses the distance between the target point and each endpoint as a value of the voltage between each phase line and the neutral point. The fault detection apparatus may calculate the distance between the target point and each endpoint based on the coordinates of the target point and coordinates of each endpoint of the target triangle model by using a Euclidean distance calculation formula.

For example, as shown in FIG. 4, in the target triangle model ABC, distances between the point N and all endpoints are respectively AN, BN, and CN, and each correspond to the voltage between each phase line and the neutral point.

S303: The fault detection apparatus determines a voltage between the neutral line and the neutral point based on a voltage between each phase line and the neutral line and the voltage between each phase line and the neutral point.

After determining the voltage between each phase line and the neutral point, the fault detection apparatus first determines, based on the voltage between each phase line and the neutral line and the voltage between each phase line and the neutral point, a target difference corresponding to each phase line, where a target difference corresponding to a target phase line is a difference between the following two voltages: a voltage between the target phase line and the neutral line and a voltage between the target phase line and the neutral point; and then uses a largest value in target differences corresponding to the three phase lines as the voltage between the neutral line and the neutral point.

S304: The fault detection apparatus determines, based on the voltage between the neutral line and the neutral point, whether a line break fault occurs in the neutral line.

After determining the voltage between the neutral line and the neutral point, the fault detection apparatus determines whether the voltage between the neutral line and the neutral point is greater than a specified threshold; and if determining that the voltage between the neutral line and the neutral point is greater than the specified threshold, determines that the line break fault occurs in the neutral line, or if determining that the voltage between the neutral line and the neutral point is not greater than the specified threshold, determines that the line break fault does not occur in the neutral line.

In some embodiments of this application, after determining that the line break fault occurs in the neutral line, the fault detection apparatus may output prompt information that the line break fault occurs in the neutral line.

In the foregoing embodiments, the three-phase unbalanced circuit is formed, so that deviations of voltages in the three phase lines from a voltage in the neutral line are greater than deviations of the voltages in the three phase lines from a voltage in a true neutral line in the three-phase power distribution system. Then, the target triangle model is established based on the voltages that are between the neutral line and the three phase lines and that are obtained through sampling, the target point corresponding to an accurate coordinate location of the neutral point is determined according to a plane geometric principle, the distance between the target point and each endpoint of the target triangle model is determined, and the distance is used as the voltage between each phase line and the target point. Finally, the voltage between the neutral line and the neutral point is obtained based on a difference between a three phase-to-neutral line voltage calculated through comparison and a three phase-to-reference ground (neutral line) voltage obtained through sampling, and fault detection is performed. According to the method, whether the line break fault occurs in the neutral line is directly determined based on the voltage between the neutral point and the neutral line. The three phase-to-true neutral line voltage may be accurately detected in scenarios in which a PE line is not connected, a three-phase grid is unbalanced, there are harmonics, and the like, and whether the line break fault occurs in the neutral line is determined. Therefore, the method can reduce false detection because of high grid adaptability. This improves detection accuracy. In addition, in this method, different voltage data in the three-phase power distribution system is mapped to a mathematical model, and partial sampling measurement is replaced with mathematical calculation, which can further reduce an error caused by sampling measurement and improve fault detection accuracy.

The following describes in detail the method for determining the target point corresponding to the target triangle model in step S302.

Figure 5:
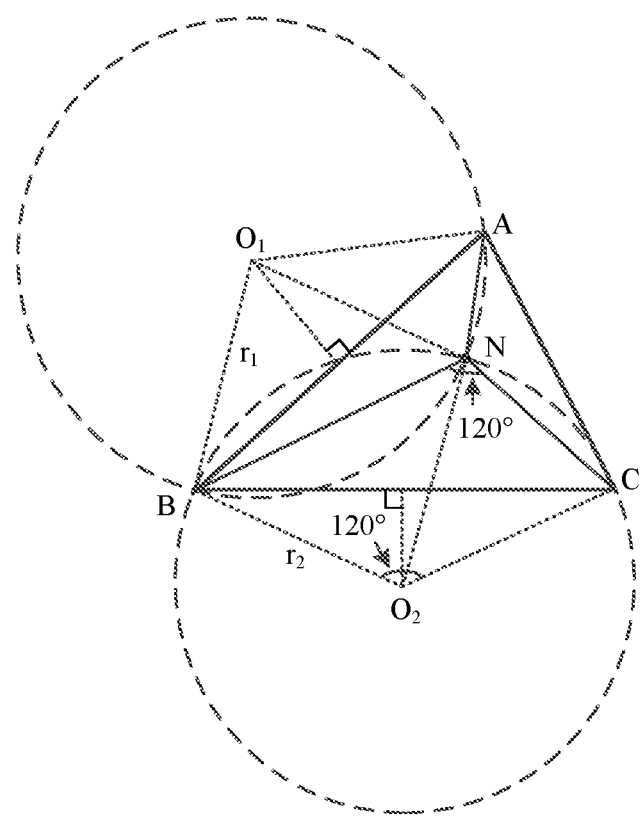
FIG. 5 is a schematic diagram of a target triangle model and a target circle model according to an embodiment of this application.

FIG. 5 is a schematic diagram of a target triangle model and a target circle model according to an embodiment of this application.

For example, as shown in FIG. 5, it is assumed that in the target triangle model ABC, a first side length is AB and a second side length is BC. It is assumed that a circle that uses a point $O_1$ as a circle center and uses $r_1$ as a radius is the first target circle model, and a circle that uses a point $O_2$ as a circle center and uses $r_2$ as a radius is the second target circle model.

In this case, the terminal device may determine coordinates of the target point, that is, the point N, in either of Manners 1 and 2.

Manner 1

In this manner, the specified coordinate system may be any coordinate system in which the established target triangle model is located.

As shown in FIG. 5, in the first target circle model, a triangle $AO_1N$, a triangle $BO_1N$, and a triangle $O_1BA$ each are an isosceles triangle. Therefore, it can be determined that a sum of sizes of an angle $O_1AN$ and an angle $O_1BN$ is equal to a size of an angle ANB and is 120° (that is, $\angle O_1AN+\angle O_1BN=\angle ANB=120°$), and it can be further determined that a size of an angle $AO_1B$ is also 120°, and a size of an angle $O_1BA$ is 30°. In this case, a relationship between the radius $r_1$ and a length of the side AB satisfies the following formula:

$$(V_{AB}/2)/r_1=\sqrt{3}/2$$

Herein, $V_A$ is the length of the side AB and represents the voltage between the line A and the line B in the three-phase power distribution system.

$V_{AB}$ also satisfies the following formula:

$$V_{AB}=\sqrt{(x_{11}-x_{12})^2+(y_{11}-y_{12})^2}$$

Herein, ($x_{11}$ and $y_{11}$) and ($x_{12}$ and $y_{12}$) are respectively coordinates of an endpoint A and an endpoint B of the first side length AB.

Similarly, in the second target circle model, a relationship between the radius $r_2$ and a length of the side BC satisfies the following formula:

$$(V_{BC}/2)/r_2=\sqrt{3}/2$$

Herein, $V_{BC}$ is the length of the side BC and represents the voltage between the line B and the line C in the three-phase power distribution system.

$V_{BC}$ also satisfies the following formula:

$$V_{BC}=\sqrt{(x_{12}-x_{13})^2+(y_{12}-y_{13})^2}$$

Herein, ($x_{12}$, $y_{12}$) and ($x_{13}$, $y_{13}$) are respectively coordinates of the endpoint B and an endpoint C of the second side length BC.

According to a Euclidean distance formula, the length of the side AB can be determined based on the coordinates of the two points A and B, and a size of $r_1$ can be determined. In addition, a size of $r_1$ can also be determined based on coordinates of the point $O_1$ and the coordinates of the point A or based on the coordinates of the point $O_1$ and the coordinates of the point B. Therefore, the following equations can be obtained:

$$\begin{cases}(x_1-x_{11}^2)+(y_1-y_{11}^2)=V_{AB}^2/3\\(x_1-x_{12}^2)+(y_1-y_{12}^2)=V_{AB}^2/3\end{cases}$$

Herein, ($x_1$, $y_1$) is the coordinates of the center point, that is, the point $O_1$, of the first target circle model, ($x_{11}$, $y_{11}$) and ($x_{12}$, $y_{12}$) are respectively the coordinates of the endpoint A and the endpoint B of the first side length AB, and $V_{AB}$ is the length of the first side length AB.

The coordinates of the point $O_1$ can be obtained by solving the foregoing equations.

Similarly, coordinates of the center point, that is, the point $O_2$, of the second target circle model can be obtained by using the foregoing method.

After the fault detection apparatus separately determines the coordinates of the center point, that is, the point $O_1$, of the first target circle model and the coordinates of the center point, that is, the point $O_2$, of the second target circle model by using the foregoing method, the following equations can be obtained:

$$\begin{cases}(x-x_1^2)+(y-y_1^2)=V_{AB}^2/3\\(x-x_2^2)+(y-y_2^2)=V_{BC}^2/3\end{cases}$$

Herein, (x, y) is coordinates of the target point, ($x_1$, $y_1$) is the coordinates of the center point, that is, the point $O_1$, ($x_2$, $y_2$) is the coordinates of the center point, that is, the point $O_2$, $V_{AB}$ is the length of the first side length AB, and $V_{BC}$ is the length of the first side length BC.

The coordinates of the target point can be obtained by solving the foregoing equations.

In this manner, after the specified coordinate system in which the target triangle model is located is established, coordinates of each endpoint of the target triangle in the specified coordinate system can be determined, coordinates of a circle center of the target circle model can be calculated based on plane geometric features of the target triangle model and the established target circle model, and the coordinates of each endpoint of the target triangle model, and the coordinates of the target point can be calculated based on coordinates of a related feature point.

Manner 2

In this manner, the coordinate origin of the specified coordinate system may be any endpoint of the target triangle model, one coordinate axis of the specified coordinate system coincides with any side length of the coordinate origin, and the other coordinate axis is perpendicular to the side length.

Figure 6:
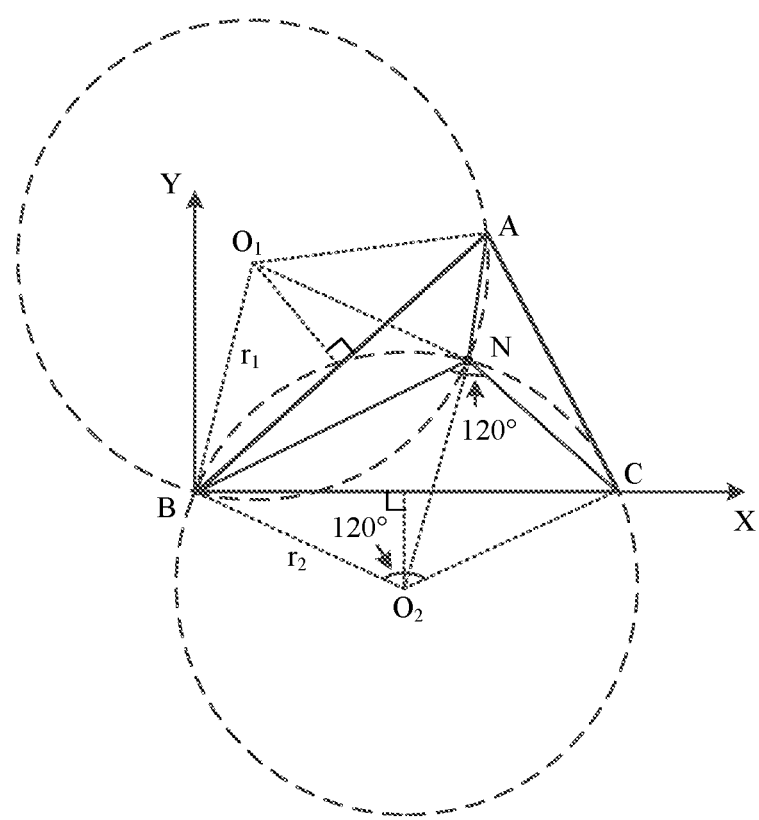
FIG. 6 is a schematic diagram of a target triangle model and a target circle model according to an embodiment of this application.

FIG. 6 is a schematic diagram of a target triangle model and a target circle model according to an embodiment of this application.

For example, in this manner, in the target triangle model shown in FIG. 5, the fault detection apparatus may select the endpoint B of the triangle ABC as the origin of the specified coordinate system, select the second side length BC as a horizontal coordinate axis (X axis) of the specified coordinate system, and use a straight line that is perpendicular to the second side length BC and that passes through the point B as a vertical coordinate axis (Y axis) of the specified coordinate system, to obtain a coordinate system XBY shown in FIG. 6.

As shown in FIG. 6, if a size of an angle $AO_1B$ is 120°, and a size of an angle $O_1BA$ is 30°, a relationship between the radius $r_1$ and the length of the side AB satisfies the following formula:

$$(V_{AB}/2)/r_1 = \sqrt{3}/2$$

Herein, $V_{AB}$ is the length of the side AB and represents the voltage between the line A and the line B in the three-phase power distribution system.

In this case, coordinates of the point $O_1$ and coordinates of the point $O_2$ can be obtained according to the sine theorem and the cosine theorem of the triangle.

The coordinates of the point $O_1$ are:

$$\begin{cases} x_1 = \dfrac{V_{BC}}{2} \\ y_1 = -\dfrac{V_{BC}}{2\sqrt{3}} \end{cases}$$

Herein, $(x_1, y_1)$ is the coordinates of the point $O_1$, and $V_{BC}$ is the length of the side BC and represents the voltage between the line B and the line C in the three-phase power distribution system.

The coordinates of the point $O_2$ are:

$$\begin{cases} x_2 = \dfrac{V_{AB}}{\sqrt{3}}\cos(\varphi + 30°) \\ y_2 = \dfrac{V_{AB}}{\sqrt{3}}\sin(\varphi + 30°) \end{cases}$$

Herein, $\cos\varphi = (V_{AB}^2 + V_{BC}^2 - V_{CA}^2)/(2V_{AB}V_{BC})$, $(x_2, y_2)$ is the coordinates of the point $O_2$, $V_{AB}$ is the length of the side AB and represents the voltage between the line A and the line B in the three-phase power distribution system, $V_{BC}$ is the length of the side BC and represents the voltage between the line B and the line C in the three-phase power distribution system, $V_{CA}$ is a length of the side CA and represents a voltage between the line C and the line A in the three-phase power distribution system, and $\varphi$ is an angle ABC and represents a phase difference between $V_{AB}$ and $V_{BC}$.

After the fault detection apparatus obtains the coordinates of the point $O_1$ and the coordinates of the point $O_2$, the following equations can be obtained according to a round angle distance formula:

$$\begin{cases} (x - x_1^2) + (y - y_1^2) = (0 - x_1)^2 + (0 - y_1)^2 \\ (x - x_2^2) + (y - y_2^2) = (0 - x_2)^2 + (0 - y_2)^2 \end{cases}$$

Herein, (x, y) is the coordinates of the target point, $(x_1, y_1)$ is the coordinates of the point $O_1$, and $(x_2, y_2)$ is the coordinates of the point $O_2$.

The following can be obtained by solving the equations:

$$\begin{cases} x = [2x_1y_2(y_2 - y_1) + 2x_2y_1(y_1 - y_2)]/[(x_1 - x_2)^2 + (y_1 - y_2)^2] \\ y = [2x_1y_2(x_1 - x_2) + 2x_2y_1(x_2 - x_1)]/[(x_1 - x_2)^2 + (y_1 - y_2)^2] \end{cases}$$

Herein, (x, y) is the coordinates of the target point, $(x_1, y_1)$ is the coordinates of the point $O_1$, and $(x_2, y_2)$ is the coordinates of the point $O_2$.

Further, a distance between the target point and each endpoint can be obtained as follows:

$$\begin{cases} V_{AN} = \sqrt{(V_{AB}\cos\varphi - x)^2 + (V_{AB}\sin\varphi - y)^2} \\ V_{BN} = \sqrt{x^2 + y^2} \\ V_{CN} = \sqrt{(V_{AB} - x)^2 + y^2} \end{cases}$$

Herein, $V_{AN}$ is a length of a line segment AN and represents a voltage between the line A and the neutral point in the three-phase power distribution system, $V_{BN}$ is a length of a line segment BN and represents a voltage between the line B and the neutral point in the three-phase power distribution system, $V_{CN}$ is a length of a line segment CN and represents a voltage between the line C and the neutral point in the three-phase power distribution system, (x, y) is the coordinates of the target point, and $\varphi$ is the angle ABC and represents the phase difference between $V_{AB}$ and $V_{BC}$.

In this manner, the specified coordinate system is set in a specific manner, so that some reference points (for example, the center point of the target circle model) fall on a right triangle at a specific angle. In this case, coordinates of the reference points can be directly determined based on side lengths, angles, and geometric distribution characteristics of the right triangle, to avoid a large amount of calculation of related coordinates. Therefore, calculation steps can be simplified, an amount of data calculation can be reduced, and the coordinates of the target point can be determined more quickly and simply.

In the foregoing embodiments provided in this application, the fault detection method for the three-phase power distribution system that is provided in the embodiments of this application is described from a perspective of the fault detection apparatus as an execution body. To implement functions in the fault detection method for the three-phase power distribution system that is provided in the embodiments of this application, the fault detection apparatus may include a hardware structure and/or a software module, and implement the foregoing functions in a form of the hardware structure, the software module, or a combination of the hardware structure and the software module. Whether a function in the foregoing functions is performed by using the hardware structure, the software module, or the combination of the hardware structure and the software module depends on particular applications and design constraints of the technical solutions.

Based on the foregoing embodiments and a same technical concept, an embodiment of this application further provides a fault detection apparatus for a three-phase power distribution system, to implement a fault detection function of the three-phase power distribution system provided in this application. The three-phase power distribution system includes three phase lines and a neutral line. The three phase lines intersect with the neutral line at a neutral point, the three phase lines include a first phase line, a second phase line, and a third phase line, and at least one of the three phase lines is connected to the neutral line.

Figure 7:
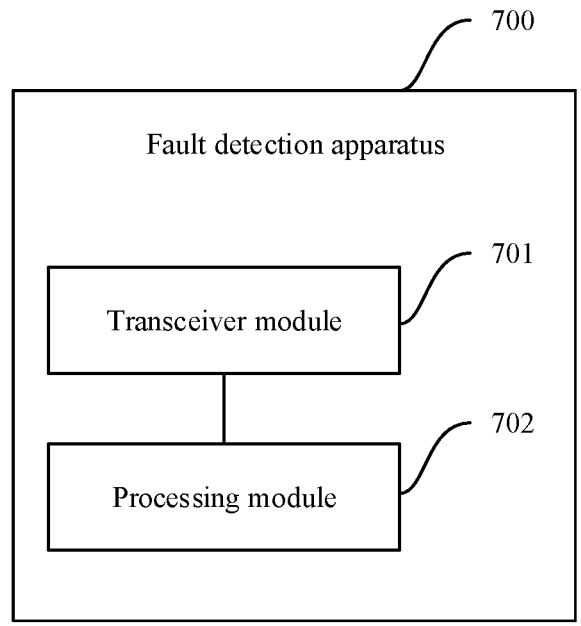
FIG. 7 is a schematic diagram of a fault detection apparatus according to an embodiment of this application.

FIG. 7 is a schematic diagram of a fault detection apparatus according to an embodiment of this application. As shown in FIG. 7, the fault detection apparatus 700 may include a transceiver module 701 and a processing module 702.

The transceiver module 701 is configured to obtain a voltage between every two phase lines.

The processing module 702 is configured to: determine a voltage between each phase line and the neutral point based on the voltage between every two phase lines; determine a voltage between the neutral line and the neutral point based on a voltage between each phase line and the neutral line and the voltage between each phase line and the neutral point; and determine, based on the voltage between the neutral line and the neutral point, whether a line break fault occurs in the neutral line.

In a possible design, any phase line connected to the neutral line is connected to the neutral line by using a resistor element.

In a possible design, when obtaining the voltage between every two phase lines, the transceiver module 701 is specifically configured to: obtain the voltage between each phase line and the neutral line; and determine the voltage between every two phase lines based on the voltage between each phase line and the neutral line.

In a possible design, when obtaining the voltage between every two phase lines, the transceiver module 701 is specifically configured to: obtain a voltage between the first phase line and the neutral line, a voltage between the second phase line and the neutral line, and a voltage between the first phase line and the third phase line; determine a voltage between the first phase line and the second phase line based on the voltage between the first phase line and the neutral line and the voltage between the second phase line and the neutral line; determine a voltage between the third phase line and the neutral line based on the voltage between the first phase line and the neutral line and the voltage between the first phase line and the third phase line; and determine a voltage between the second phase line and the third phase line based on the voltage between the second phase line and the neutral line and the voltage between the third phase line and the neutral line.

In a possible design, the voltage between the first phase line and the second phase line satisfies the following formula:

$$V_1 = |\sqrt{V_2^2 + V_3^2 - 2V_2V_3\cos\theta}|$$

Herein, $V_1$ is the voltage between the first phase line and the second phase line, $V_2$ is the voltage between the first phase line and the neutral line, $V_3$ is the voltage between the second phase line and the neutral line, and $\theta$ is a phase difference between $V_2$ and $V_3$.

In a possible design, the voltage between the third phase line and the neutral line satisfies the following formula:

$$V_4 = |\sqrt{V_5^2 + V_6^2 - 2V_5V_6\cos\sigma}|$$

Herein, $V_4$ is the voltage between the third phase line and the neutral line, $V_5$ is the voltage between the first phase line and the neutral line, $V_6$ is the voltage between the first phase line and the third phase line, and $\sigma$ is a phase difference between $V_5$ and $V_6$.

In a possible design, when determining the voltage between each phase line and the neutral point based on the voltage between every two phase lines, the processing module 702 is specifically configured to: construct a target triangle model in a specified coordinate system based on the voltage between every two phase lines, where three side lengths of the target triangle model each are the voltage between every two phase lines; determine, in the specified coordinate system, a target point corresponding to the target triangle model, where an included angle of 120° can be formed by intersecting connection lines between the target point and any two endpoints of the target triangle model; determine a distance between the target point and each endpoint of the target triangle model; and use the distance between the target point and each endpoint as a value of the voltage between each phase line and the neutral point.

In a possible design, if three interior angles of the target triangle model each are less than 120°, the target point is a Fermat point of the target triangle model, or the target point is a positive equiangular center point of the target triangle model.

In a possible design, the three side lengths of the target triangle model are a first side length, a second side length, and a third side length. When determining, in the specified coordinate system, the target point corresponding to the target triangle model, the processing module is specifically configured to: construct, in the specified coordinate system, a first target circle model corresponding to the first side length and a second target circle model corresponding to the second side length, where the first target circle model includes two endpoints of the first side length and the target point, and the second target circle model includes two endpoints of the second side length and the target point; determine coordinates of a circle center of the first target circle model based on coordinates of the two endpoints of the first side length, and determine coordinates of a circle center of the second target circle model based on coordinates of the two endpoints of the second side length; and determine coordinates of the target point based on the coordinates of the circle center of the first target circle model and the coordinates of the circle center of the second target circle model.

In a possible design, the coordinate origin of the specified coordinate system is any endpoint of the target triangle model, and a coordinate axis of the specified coordinate system coincides with a side length of the coordinate origin in the target triangle model.

In a possible design, when determining the voltage between the neutral line and the neutral point based on the voltage between each phase line and the neutral line and the voltage between each phase line and the neutral point, the processing module 702 is specifically configured to: determine a target difference corresponding to each phase line, where a target difference corresponding to a target phase line is a difference between the following two voltages: a voltage between the target phase line and the neutral line and a voltage between the target phase line and the neutral point;

and use a largest value in target differences corresponding to the three phase lines as the voltage between the neutral line and the neutral point.

In a possible design, when determining, based on the voltage between the neutral line and the neutral point, whether the line break fault occurs in the neutral line, the processing module 702 is specifically configured to: determine whether the voltage between the neutral line and the neutral point is greater than a specified threshold; and if determining that the voltage between the neutral line and the neutral point is greater than the specified threshold, determine that the line break fault occurs in the neutral line, or if determining that the voltage between the neutral line and the neutral point is not greater than the specified threshold, determine that the line break fault does not occur in the neutral line.

In the embodiments of this application, division into the modules is an example, and is merely logical function division. There may be another division manner in actual implementation. In addition, functional modules in the embodiments of this application may be integrated into one processor, or each of the modules may exist alone physically, or two or more modules are integrated into one module. The integrated module may be implemented in a form of hardware, or may be implemented in a form of a software functional module.

Figure 8:
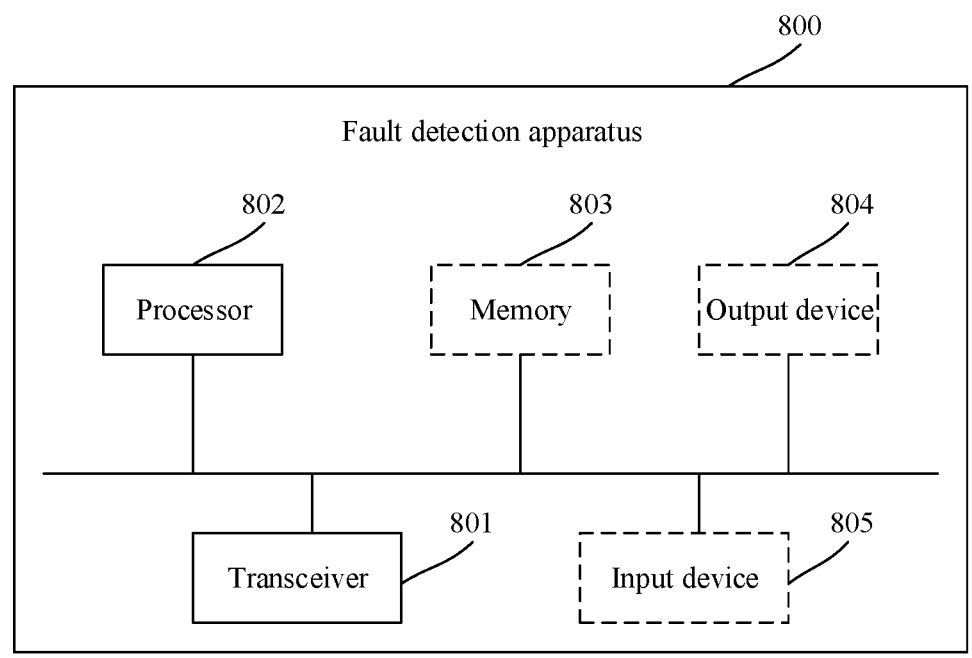
FIG. 8 is a schematic diagram of a structure of a fault detection apparatus according to an embodiment of this application.

Based on the foregoing embodiments and a same technical concept, an embodiment of this application further provides a fault detection apparatus for a three-phase power distribution system, to implement a fault detection function of the three-phase power distribution system provided in this application. FIG. 8 is a schematic diagram of a fault detection apparatus according to an embodiment of this application. The fault detection apparatus may be user equipment, or may be a chip or a chip system in the user equipment.

In some embodiments of this application, the fault detection apparatus may alternatively be a structure such as a terminal device, a network device, an electronic device, or an integrated circuit that can perform the fault detection method for the three-phase power distribution system that is provided in this application.

The three-phase power distribution system includes three phase lines and a neutral line. The three phase lines intersect with the neutral line at a neutral point, the three phase lines include a first phase line, a second phase line, and a third phase line, and at least one of the three phase lines is connected to the neutral line.

For example, the fault detection apparatus 800 includes a transceiver 801 and at least one processor 802. The processor 802 and the transceiver 801 are coupled to each other. In this embodiment of this application, the coupling is an indirect coupling or a communication connection between apparatuses, units, or modules, may be in an electrical, mechanical, or another form, and is used for information exchange between the apparatuses, units, or modules.

Specifically, the transceiver 801 may be a circuit, a bus, a communication interface, or any other module that may be configured to perform information exchange, and may be configured to: receive or send information.

Optionally, the apparatus 800 may further include a memory 803. The memory 803 is coupled to the transceiver 801 and the processor 802, and is configured to store program instructions.

The processor 802 is configured to invoke the program instructions stored in the memory 803, so that the fault detection apparatus 800 performs the fault detection method for the three-phase power distribution system provided in this embodiment of this application, to implement fault detection on the three-phase power distribution system.

The transceiver 801 may be configured to: receive and send a radio frequency signal, and is coupled to a receiver and a transmitter in the fault detection apparatus 800. The transceiver 801 may communicate with a communication network and another communication device by using the radio frequency signal, for example, an Ethernet, a radio access network (RAN), or a wireless local area network (WLAN). In a specific implementation, communication protocols supported by the transceiver 801 may include a Wi-Fi protocol, 2G/3G, long term evolution (LTE), 5G new radio (NR), and the like. The transceiver 801 may also have a specific data processing function.

During specific implementation, the memory 803 may include a high-speed random access memory, and may also include a non-volatile memory, for example, one or more magnetic disk storage devices, a flash memory device, or another non-volatile solid-state storage device. The memory 803 may store an operating system (briefly referred to as a system below), for example, an embedded operating system such as Android, iOS, Windows, or Linux. The memory 803 may be configured to store an implementation program in this embodiment of this application. The memory 803 may further store a network communication program. The network communication program may be used to communicate with one or more additional devices, one or more user equipment, or one or more network devices.

The processor 802 may be a general-purpose central processing unit (CPU), a microprocessor, an application-specific integrated circuit (ASIC), or one or more integrated circuits configured to control execution of programs of the solutions of this application.

In some embodiments, the fault detection apparatus 800 may further include an output device 804 and an input device 805. The output device 804 communicates with the processor 802, and may display information in a plurality of manners. For example, the output device 804 may be a liquid crystal display (LCD), a light-emitting diode (LED) display device, a cathode ray tube (CRT) display device, or a projector. The input device 805 communicates with the processor 802, and may receive a user input in a plurality of manners. For example, the input device 805 may be a mouse, a keyboard, a touchscreen device, or a sensor device. For ease of user use of the output device 804 and the input device 805, in some embodiments, the memory 803 may further store a user interface program. The user interface program may vividly display content of an application program through a graphical operating interface, and receive a control operation of a user on the application program by using an input control, for example, a menu, a dialog box, or a key.

The memory in the communication fault detection apparatus 800 may store one or more software modules, and may be configured to provide functions such as data calculation, model establishment, and line break fault determining. For details, refer to the foregoing embodiments.

For example, the transceiver 801 is configured to obtain a voltage between every two phase lines. The processor 802 is configured to: determine a voltage between each phase line and the neutral point based on the voltage between every two phase lines; determine a voltage between the neutral line and the neutral point based on a voltage between each phase line and the neutral line and the voltage between each phase line and the neutral point; and determine, based on the voltage between the neutral line and the neutral point, whether a line break fault occurs in the neutral line.

In a possible design, any phase line connected to the neutral line is connected to the neutral line by using a resistor element.

In a possible design, when obtaining the voltage between every two phase lines, the transceiver 801 is specifically configured to: obtain the voltage between each phase line and the neutral line; and determine the voltage between every two phase lines based on the voltage between each phase line and the neutral line.

In a possible design, when obtaining the voltage between every two phase lines, the transceiver 801 is specifically configured to: obtain a voltage between the first phase line and the neutral line, a voltage between the second phase line and the neutral line, and a voltage between the first phase line and the third phase line; determine a voltage between the first phase line and the second phase line based on the voltage between the first phase line and the neutral line and the voltage between the second phase line and the neutral line; determine a voltage between the third phase line and the neutral line based on the voltage between the first phase line and the neutral line and the voltage between the first phase line and the third phase line; and determine a voltage between the second phase line and the third phase line based on the voltage between the second phase line and the neutral line and the voltage between the third phase line and the neutral line.

In a possible design, the voltage between the first phase line and the second phase line satisfies the following formula:

$$V_1 = |\sqrt{V_2^2 + V_3^2 - 2V_2V_3\cos\theta}|$$

Herein, $V_1$ is the voltage between the first phase line and the second phase line, $V_2$ is the voltage between the first phase line and the neutral line, $V_3$ is the voltage between the second phase line and the neutral line, and $\theta$ is a phase difference between $V_2$ and $V_3$.

In a possible design, the voltage between the third phase line and the neutral line satisfies the following formula:

$$V_4 = |\sqrt{V_5^2 + V_6^2 - 2V_5V_6\cos\sigma}|$$

Herein, $V_4$ is the voltage between the third phase line and the neutral line, $V_5$ is the voltage between the first phase line and the neutral line, $V_6$ is the voltage between the first phase line and the third phase line, and $\sigma$ is a phase difference between $V_5$ and $V_6$.

In a possible design, when determining the voltage between each phase line and the neutral point based on the voltage between every two phase lines, the processor 802 is specifically configured to: construct a target triangle model in a specified coordinate system based on the voltage between every two phase lines, where three side lengths of the target triangle model each are the voltage between every two phase lines; determine, in the specified coordinate system, a target point corresponding to the target triangle model, where an included angle of 120° can be formed by intersecting connection lines between the target point and any two endpoints of the target triangle model; determine a distance between the target point and each endpoint of the target triangle model; and use the distance between the target point and each endpoint as a value of the voltage between each phase line and the neutral point.

In a possible design, if three interior angles of the target triangle model each are less than 120°, the target point is a Fermat point of the target triangle model, or the target point is a positive equiangular center point of the target triangle model.

In a possible design, the three side lengths of the target triangle model are a first side length, a second side length, and a third side length. When determining, in the specified coordinate system, the target point corresponding to the target triangle model, the processor is specifically configured to: construct, in the specified coordinate system, a first target circle model corresponding to the first side length and a second target circle model corresponding to the second side length, where the first target circle model includes two endpoints of the first side length and the target point, and the second target circle model includes two endpoints of the second side length and the target point; determine coordinates of a circle center of the first target circle model based on coordinates of the two endpoints of the first side length, and determine coordinates of a circle center of the second target circle model based on coordinates of the two endpoints of the second side length; and determine coordinates of the target point based on the coordinates of the circle center of the first target circle model and the coordinates of the circle center of the second target circle model.

In a possible design, the coordinate origin of the specified coordinate system is any endpoint of the target triangle model, and a coordinate axis of the specified coordinate system coincides with a side length of the coordinate origin in the target triangle model.

In a possible design, when determining the voltage between the neutral line and the neutral point based on the voltage between each phase line and the neutral line and the voltage between each phase line and the neutral point, the processor 802 is specifically configured to: determine a target difference corresponding to each phase line, where a target difference corresponding to a target phase line is a difference between the following two voltages: a voltage between the target phase line and the neutral line and a voltage between the target phase line and the neutral point; and use a largest value in target differences corresponding to the three phase lines as the voltage between the neutral line and the neutral point.

In a possible design, when determining, based on the voltage between the neutral line and the neutral point, whether the line break fault occurs in the neutral line, the processor 802 is specifically configured to: determine whether the voltage between the neutral line and the neutral point is greater than a specified threshold; and if determining that the voltage between the neutral line and the neutral point is greater than the specified threshold, determine that the line break fault occurs in the neutral line, or if determining that the voltage between the neutral line and the neutral point is not greater than the specified threshold, determine that the line break fault does not occur in the neutral line.

It should be noted that FIG. 8 is merely an implementation of this embodiment of this application. In actual application, a fault detection apparatus 800 may further include more or fewer components. This is not limited herein.

Based on the foregoing embodiments and a same technical concept, an embodiment of this application further provides a computer-readable storage medium. The computer-readable storage medium stores computer program instructions. When the computer program instructions are run on a fault detection apparatus, the fault detection apparatus is enabled to perform the fault detection method for the three-phase power distribution system that is provided in the foregoing embodiments.

Based on the foregoing embodiments and a same technical concept, an embodiment of this application further provides a computer program product. When the computer program product runs on a fault detection apparatus, the fault detection apparatus is enabled to perform the fault detection method for the three-phase power distribution system that is provided in the foregoing embodiments.

Based on the foregoing embodiments and a same technical concept, an embodiment of this application further provides a chip. The chip is configured to read a computer program stored in a memory, to perform the fault detection method for the three-phase power distribution system that is provided in the foregoing embodiments.

Persons skilled in the art should understand that the embodiments of this application may be provided as a method, a system, or a computer program product. Therefore, this application may use a form of hardware only embodiments, software only embodiments, or embodiments with a combination of software and hardware. Moreover, this application may use a form of a computer program product that is implemented on one or more computer-usable storage media (including but not limited to a disk memory, a CD-ROM, an optical memory, and the like) that include computer usable program code.

This application is described with reference to the flowcharts and/or block diagrams of the method, the device (system), and the computer program product according to this application. It should be understood that computer program instructions may be used to implement each process and/or each block in the flowcharts and/or the block diagrams and a combination of a process and/or a block in the flowcharts and/or the block diagrams. These computer program instructions may be provided for a general-purpose computer, a dedicated computer, an embedded processor, or a processor of another programmable data processing device to generate a machine, so that the instructions executed by the computer or the processor of the another programmable data processing device generate an apparatus for implementing a specific function in one or more processes in the flowcharts and/or in one or more blocks in the block diagrams.

These computer program instructions may alternatively be stored in a computer-readable memory that can indicate a computer or another programmable data processing device to work in a specific manner, so that the instructions stored in the computer-readable memory generate an artifact that includes an instruction apparatus. The instruction apparatus implements a specific function in one or more processes in the flowcharts and/or in one or more blocks in the block diagrams.

These computer program instructions may alternatively be loaded onto a computer or another programmable data processing device, so that a series of operations and steps are performed on the computer or the another programmable device, thereby generating computer-implemented processing. In this way, the instructions executed on the computer or the another programmable device provide steps for implementing a specified function in one or more processes in the flowcharts and/or in one or more blocks in the block diagrams.

It is clear that persons skilled in the art can make various modifications and variations to this application without departing from the protection scope of this application. This application is intended to cover these modifications and variations of this application provided that they fall within the scope of protection defined by the claims of this application and equivalent technologies thereof.

What is claimed is:

1. A fault detection method for a three-phase power distribution system, wherein the three-phase power distribution system comprises three phase lines and a neutral line, wherein the three phase lines intersect with the neutral line at a neutral point, the three phase lines comprise a first phase line, a second phase line, and a third phase line, the method comprising:
   obtaining a voltage between every two phase lines;
   obtaining a voltage between each phase line and the neutral point based on the voltage between every two phase lines;
   obtaining a voltage between the neutral line and the neutral point based on a voltage between each phase line and the neutral line and the voltage between each phase line and the neutral point; and
   detecting whether a line break fault occurs in the neutral line, based on the voltage between the neutral line and the neutral point.

2. The method according to claim 1, wherein any phase line connected to the neutral line is connected to the neutral line by using a resistor element.

3. The method according to claim 1, wherein the obtaining the voltage between every two phase lines comprises:
   obtaining the voltage between each phase line and the neutral line; and
   obtaining the voltage between every two phase lines based on the voltage between each phase line and the neutral line.

4. The method according to claim 1, wherein the obtaining the voltage between every two phase lines comprises:
   obtaining a voltage between the first phase line and the neutral line, a voltage between the second phase line and the neutral line, and a voltage between the first phase line and the third phase line;
   obtaining a voltage between the first phase line and the second phase line based on the voltage between the first phase line and the neutral line and the voltage between the second phase line and the neutral line;
   obtaining a voltage between the third phase line and the neutral line based on the voltage between the first phase line and the neutral line and the voltage between the first phase line and the third phase line; and
   obtaining a voltage between the second phase line and the third phase line based on the voltage between the second phase line and the neutral line and the voltage between the third phase line and the neutral line.

5. The method according to claim 3, wherein the voltage between the first phase line and the second phase line satisfies:

$$V_1 = |\sqrt{V_2^2 + V_3^2 - 2V_2V_3\cos\theta}|, \text{ wherein}$$

$V_1$ is the voltage between the first phase line and the second phase line, $V_2$ is the voltage between the first phase line and the neutral line, $V_3$ is the voltage between the second phase line and the neutral line, and $\theta$ is a phase difference between $V_2$ and $V_3$.

6. The method according to claim 1, wherein the obtaining the voltage between each phase line and the neutral point based on the voltage between every two phase lines comprises:
   constructing a target triangle model in a specified coordinate system based on the voltage between every two phase lines, wherein three side lengths of the target triangle model each are the voltage between every two phase lines;
   obtaining, in the specified coordinate system, a target point corresponding to the target triangle model, wherein an included angle of 120° can be formed by intersecting connection lines between the target point and any two endpoints of the target triangle model;

obtaining a distance between the target point and each endpoint of the target triangle model; and using the distance between the target point and each endpoint as a value of the voltage between each phase line and the neutral point.

7. The method according to claim 6, wherein based on three interior angles of the target triangle model each are less than 120°, the target point is a Fermat point of the target triangle model, or the target point is a positive equiangular center point of the target triangle model.

8. The method according to claim 6, wherein the three side lengths of the target triangular model are a first side length, a second side length, and a third side length, and the obtaining, in the specified coordinate system, the target point corresponding to the target triangle model comprises:

constructing, in the specified coordinate system, a first target circle model corresponding to the first side length and a second target circle model corresponding to the second side length, wherein the first target circle model comprises two endpoints of the first side length and the target point, and the second target circle model comprises two endpoints of the second side length and the target point;

obtaining coordinates of a circle center of the first target circle model based on coordinates of the two endpoints of the first side length, and obtaining coordinates of a circle center of the second target circle model based on coordinates of the two endpoints of the second side length; and obtaining coordinates of the target point based on the coordinates of the circle center of the first target circle model and the coordinates of the circle center of the second target circle model.

9. The method according to claim 6, wherein a coordinate origin of the specified coordinate system is any endpoint of the target triangle model, and a coordinate axis of the specified coordinate system coincides with a side length of the coordinate origin in the target triangle model.

10. The method according to claim 1, wherein the obtaining the voltage between the neutral line and the neutral point based on the voltage between each phase line and the neutral line and the voltage between each phase line and the neutral point comprises:

obtaining a target difference corresponding to each phase line, wherein a target difference corresponding to a target phase line is a difference between the following two voltages: a voltage between the target phase line and the neutral line and a voltage between the target phase line and the neutral point; and using a largest value in target differences corresponding to the three phase lines as the voltage between the neutral line and the neutral point.

11. The method according to claim 1, wherein to detect whether the line break fault occurs in the neutral line, the obtaining, based on the voltage between the neutral line and the neutral point, comprises:

detecting whether the voltage between the neutral line and the neutral point is greater than a specified threshold; and based on the voltage between the neutral line and the neutral point being greater than the specified threshold, detecting the line break fault occurs in the neutral line, or based on the voltage between the neutral line and the neutral point not being greater than the specified threshold, detecting the line break fault does not occur in the neutral line.

12. A fault detection apparatus for a three-phase power distribution system, wherein the three-phase power distribution system comprises three phase lines and a neutral line, wherein the three phase lines intersect with the neutral line at a neutral point, the three phase lines comprise a first phase line, a second phase line, and a third phase line, and wherein the fault detection apparatus comprises a transceiver and a processor, wherein:

the transceiver is configured to obtain a voltage between every two phase lines; and the processor is configured to:

determine a voltage between each phase line and the neutral point based on the voltage between every two phase lines;

determine a voltage between the neutral line and the neutral point based on a voltage between each phase line and the neutral line and the voltage between each phase line and the neutral point; and determine, based on the voltage between the neutral line and the neutral point, whether a line break fault occurs in the neutral line.

13. The fault detection apparatus according to claim 12, wherein any phase line connected to the neutral line is connected to the neutral line by using a resistor element.

14. The fault detection apparatus according to claim 12, wherein based on obtaining the voltage between every two phase lines, the transceiver is specifically configured to:

obtain the voltage between each phase line and the neutral line; and determine the voltage between every two phase lines based on the voltage between each phase line and the neutral line.

15. The fault detection apparatus according to claim 12, wherein based on obtaining the voltage between every two phase lines, the transceiver is specifically configured to:

obtain a voltage between the first phase line and the neutral line, a voltage between the second phase line and the neutral line, and a voltage between the first phase line and the third phase line;

determine a voltage between the first phase line and the second phase line based on the voltage between the first phase line and the neutral line and the voltage between the second phase line and the neutral line;

determine a voltage between the third phase line and the neutral line based on the voltage between the first phase line and the neutral line and the voltage between the first phase line and the third phase line; and determine a voltage between the second phase line and the third phase line based on the voltage between the second phase line and the neutral line and the voltage between the third phase line and the neutral line.

16. The fault detection apparatus according to claim 14, wherein the voltage between the first phase line and the second phase line satisfies:

$V_1 = |\sqrt{V_2^2 + V_3^2 - 2V_2 V_3 \cos\theta}|$, wherein $V_1$ is the voltage between the first phase line and the second phase line, $V_2$ is the voltage between the first phase line and the neutral line, $V_3$ is the voltage between the second phase line and the neutral line, and $\theta$ is a phase difference between $V_2$ and $V_3$.

17. The fault detection apparatus according to claim 12, wherein based on obtaining the voltage between each phase line and the neutral point based on the voltage between every two phase lines, the processor is specifically configured to:

construct a target triangle model in a specified coordinate system based on the voltage between every two phase lines, wherein three side lengths of the target triangle model each are the voltage between every two phase lines;

determine, in the specified coordinate system, a target point corresponding to the target triangle model, wherein an included angle of 120° can be formed by intersecting connection lines between the target point and any two endpoints of the target triangle model;

determine a distance between the target point and each endpoint of the target triangle model; and use the distance between the target point and each endpoint as a value of the voltage between each phase line and the neutral point.

18. The fault detection apparatus according to claim 17, wherein based on three interior angles of the target triangle model each are less than 120°, the target point is a Fermat point of the target triangle model, or the target point is a positive equiangular center point of the target triangle model.

19. The fault detection apparatus according to claim 17, wherein three side lengths of the target triangular model are a first side length, a second side length, and a third side length, and based on obtaining, in the specified coordinate system, the target point corresponding to the target triangle model, the processor is specifically configured to:

construct, in the specified coordinate system, a first target circle model corresponding to the first side length and a second target circle model corresponding to the second side length, wherein the first target circle model comprises two endpoints of the first side length and the target point, and the second target circle model comprises two endpoints of the second side length and the target point;

determine coordinates of a circle center of the first target circle model based on coordinates of the two endpoints of the first side length, and determine coordinates of a circle center of the second target circle model based on coordinates of the two endpoints of the second side length; and determine coordinates of the target point based on the coordinates of the circle center of the first target circle model and the coordinates of the circle center of the second target circle model.

20. The fault detection apparatus according to claim 17, wherein a coordinate origin of the specified coordinate system is any endpoint of the target triangle model, and a coordinate axis of the specified coordinate system coincides with a side length of the coordinate origin in the target triangle model.

* * * * *